United States Patent [19]
Kulkaski et al.

[11] Patent Number: 5,458,322
[45] Date of Patent: Oct. 17, 1995

[54] DEBRIS TRAPPING/ANTI CLIP FOR RETAINING A SEMICONDUCTOR WAFER ON A PEDESTAL

[76] Inventors: Richard Kulkaski, 1210 Gannet Ct., Forked River, N.J. 08731; Matthew P. Szapucki, 1282 W. Todd Rd., Toms River, N.J. 08755

[21] Appl. No.: 218,344

[22] Filed: Mar. 25, 1994

[51] Int. Cl.⁶ .................................................. B25B 1/00
[52] U.S. Cl. ..................... 269/254 R; 269/157; 269/265
[58] Field of Search .............................. 269/254 R, 152, 269/153, 155, 903, 268, 217, 157, 234, 138, 134, 265

[56] References Cited

U.S. PATENT DOCUMENTS

| | | |
|---|---|---|
| 4,306,731 | 12/1981 | Shaw . |
| 4,911,597 | 3/1990 | Maydan et al. . |
| 4,915,367 | 4/1990 | Carossino . |
| 4,995,063 | 2/1991 | Enoki et al. . |
| 5,040,484 | 8/1991 | Mears et al. . |
| 5,083,364 | 1/1992 | Olbrich et al. . |
| 5,116,181 | 5/1992 | Severns et al. . |
| 5,183,245 | 2/1993 | DiNapoli et al. . |
| 5,224,809 | 7/1993 | Maydan et al. . |
| 5,253,411 | 10/1993 | DiNapoli et al. . |
| 5,280,983 | 1/1994 | Maydan et al. . |

*Primary Examiner*—Robert C. Watson
*Attorney, Agent, or Firm*—Watov & Kipnes

[57] ABSTRACT

A clip assembly for retaining a semiconductor wafer on a pedestal during processing of the wafer, and releasing the wafer for removal from the pedestal after processing, includes a pair of tines each having a lower sloping surface for contacting an edge of an associated semiconductor wafer, and a ledge provided immediately above the lower sloping surface inward from a shared leading edge serves to catch debris or particulate material, preventing it from falling onto the surface of the semiconductor wafer. A metal spring, biasing the clip head into contact with the wafer, has an upper portion affixed to a front face of the clip head via an electrically nonconductive rectangularly shaped retainer for substantially reducing voltage arcing between the highly electrically charged plasma used in processing a semiconductor wafer and the clip head.

18 Claims, 3 Drawing Sheets

5,458,322

1

DEBRIS TRAPPING/ANTI CLIP FOR RETAINING A SEMICONDUCTOR WAFER ON A PEDESTAL

RELATED APPLICATION

This application is related to co-pending design application Ser. No. 29/020,496, entitled "Spring Retainer", filed herewith, and conceived by the same inventors hereof.

BACKGROUND OF THE INVENTION

1. Field of the Invention

The present invention relates generally to apparatus for manufacturing semiconductors, such as integrated circuits obtained by processing silicon wafers, and more particular relates to clips for retaining a semiconductor wafer on a pedestal of associated semiconductor processing apparatus.

2. Discussion of Related Art

Semiconductor conductor wafer processing equipment typically include one or more pedestals, that are generally vertically oriented, upon which semiconductor wafers are secured via specially designed clips to the pedestals. The clips are generally arranged around the circumference of the pedestal, in sufficient number, for securing a semiconductor wafer to the pedestal in such a manner that the clips can be operated to a position out of engagement with the edges or outer circumference of the associated wafer, for either permitting its installation or removal from the pedestal, and to another operative position for contacting typically the top edge of the wafer for safely securing the wafer to the pedestal without chipping or otherwise damaging the semiconductor wafer.

DiNapoli, et al. U.S. Pat. No. 5,183,245 (hereinafter DiNapoli), entitled "SEMI-CONDUCTOR WAFER RETENTION CLIP", shows and describes both a prior art clip (see FIG. 6 hereof), and an improvement to the securement head 91 of the prior clip, in a clip design as shown in FIG. 4 thereof (see FIG. 1 hereof). Although the present inventors believe that DiNapoli shows an improvement relative to prior clips thereto for reducing the amount of contamination to associated semiconductor wafers caused by the retention clips, the contamination problem still persists. Also, its Applicants' understanding that the improved clip design of DiNapoli, while reducing such contamination problems, increased electrical or plasma arcing problems that tend to reduce the yield of semiconductors devices from the semiconductor wafer being processed.

As taught in DiNapoli, the clip heads of the semiconductor wafer retention clips are formed of Lexan® material, a plastic material. A metal spring is used to spring bias the pedestal clip, and retain the same to a metal base member. Metal screws are used to secure the spring to the clip head thereof. During processing of the associate semiconductor wafer, plasma etching is typically used. Unfortunately, in addition to etching away selected portions of the semiconductor wafer, the plasma also causes etching or decomposition of the plastic material of the plastic clip head of the semiconductor wafer retention clip. Although the improved semiconductor wafer retention clip of DiNapoli eliminated a portion of the plastic material of the clip head, plasma etching of the remaining clip head still occurs, and results in disintegration of the plastic material of the clip head that still presents a contamination problem when some of the material removed from the clip head by the plasma falls onto the surface of the associated semiconductor wafer. This typically occurs at certain times when the clip head moves between positions for retaining the wafer and positions for not engaging the wafer. Another problem that still persists is that the chemical plasma used in the plasma etching process is generated with high voltage radio frequency or energy or electromagnetic fields, typically attaining voltage levels in the range of 2000 volts. The high energy plasma at times causes voltage arcing to surfaces such as presented by the metal screws attached to the metal spring used in the clips.

The present inventors recognize that although the semiconductor wafer retention clip improved design shown in DiNapoli does apparently reduce contamination of the semiconductor wafer from plastic material etched away from the plastic clip, the contamination problem was not eliminated, and continues to reduce the yield of semiconductor integrated circuits, and so forth, obtainable from associated semiconductor wafers after processing. Also, the previously mentioned arcing problem, when it occurs, substantially reduces the yield.

SUMMARY OF THE INVENTION

With the problems of the prior art in mind, an object of the present invention is to provide an improved clip for retaining semiconductor wafers on a pedestal during processing of the wafers.

Another object of the invention is to provide such a clip with the capability of reducing the amount of debris associated with the clip from falling onto the surface of an associated semiconductor wafer during processing.

Another object of the invention is to substantially reduce high voltage arcing between the highly charged plasma material and metal surfaces of the clip exposed to the plasma.

In one embodiment of the invention, the clip for retaining semiconductor wafers on a pedestal includes a spring biased head portion including a rearmost tab for receiving a tool that presses upon the tab for overcoming the spring biased to pull the clip head away from an associated semiconductor wafer, and further including a pair of spaced apart projecting tines having a slanted under surface for contacting a top edge portion of an associated semiconductor wafer, respectively, with each of the tines further including shelf means above a lower sloping wafer contact face, for trapping and holding debris that might otherwise fall to the surface of the semiconductor wafer during movement of the head of the clip either away from or towards the associated semiconductor wafer, or even while the clip head is at rest. In another embodiment of the invention, to substantially prevent arcing between the plasma and the clip head, electrically nonconductive spring retainer means are included for securing a flat spring to the head of the clip.

BRIEF DESCRIPTION OF THE DRAWINGS

Various embodiments of the present invention are described in detail below with reference to the drawings in which like items are indicated by the same reference designation, wherein.

DETAILED DESCRIPTION OF THE INVENTION

Figure 1:
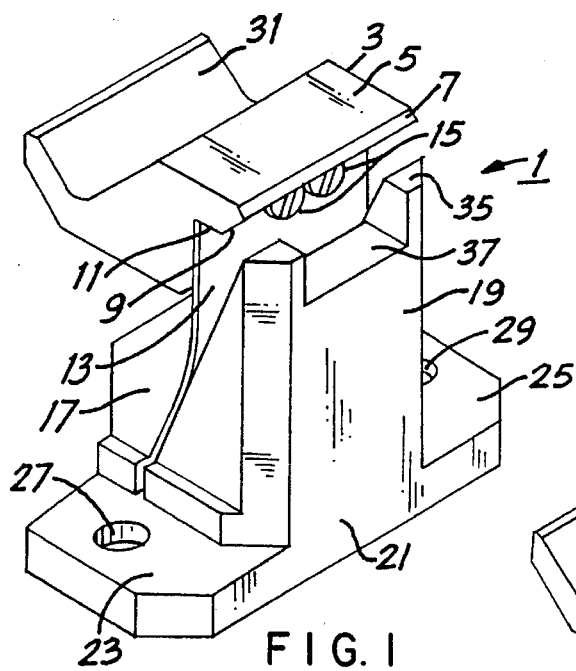
FIG. 1 is a perspective view of a prior art clip for retaining semiconductor wafers on a pedestal.
Figure 2:
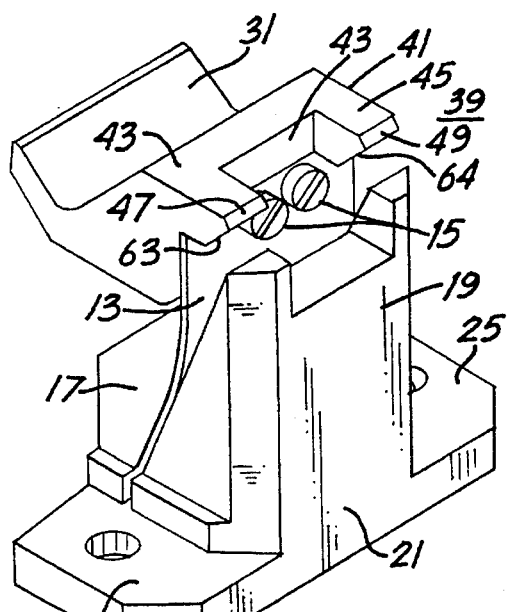
FIG. 2 is a perspective view of a prior art clip for retaining semiconductor wafers on a pedestal.
Figure 4:
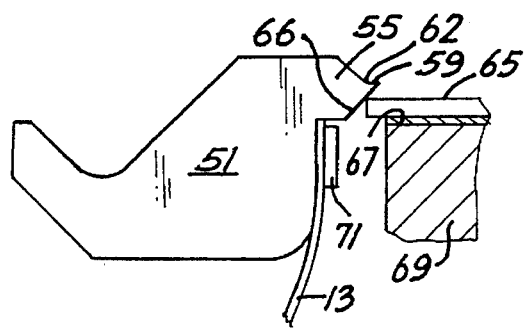
FIG. 4 is a partial cross-sectional view, and partial side view of the clip head of one embodiment of the present invention in contact with a semiconductor wafer.
Figure 5:
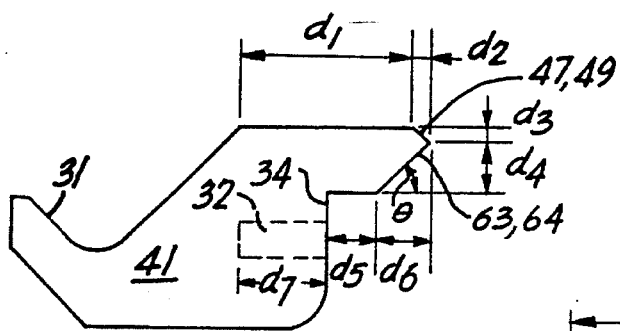
FIG. 5 is a side elevational view of the prior art clip head of FIG. 2.
Figure 6:
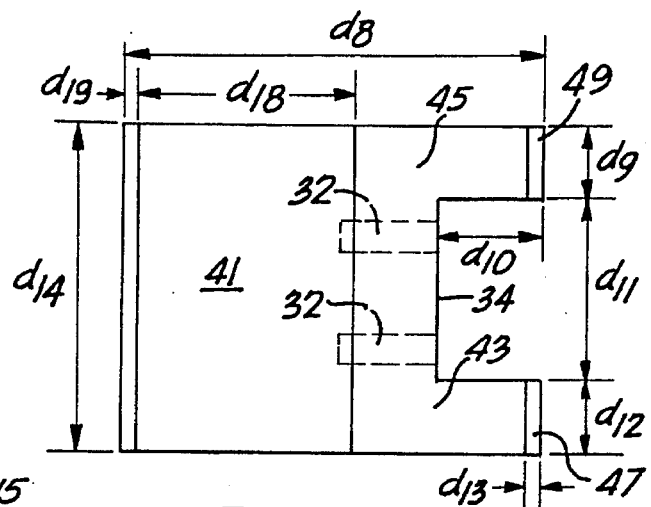
FIG. 6 is a top view of the prior art clip head of FIG. 5.

In FIGS. 1 and 2, prior art clips for retaining semiconductor wafers are shown, as shown and described in FIGS. 6 and 4 of DiNapoli et al. U.S. Pat. No. 5,183,245, respectively (hereinafter referred to as DiNapoli). The teachings of DiNapoli are incorporated herein by reference, but any discrepancies between the teachings of the present disclosure and those of DiNapoli are to be held in favor of the present description. In FIG. 1, a semiconductor wafer retention clip 1 of the prior art includes a securement or clip head 3 including a forwardmost flat top section 5 that terminates in a forwardly extending but downwardly sloping linear front edge section 7. The narrow slopping edge section 7 shares a common leading edge with a lower downward and rearward sloping narrow edge section 9. The edge section 9 terminates along a bottom edge to a narrow bottom section 11, which in turn terminates to a vertically oriented front wall of the clip head 3 to which a flexible flat metal spring 13 is secured via two metal screws 15, as shown. The other end of the spring 13 is sandwiched between a mounting member 17 and the back surface of a mounting column 19, which are secured together by means of screws (not shown), for example (see FIG. 5 of DiNapoli). The bottom of the mounting column 19 terminates into a base portion 21 having a left hand mounting flange 23 and a right hand mounting flange 25. Holes 27 and 29 are provided through mounting flanges 23 and 25, respectively, for permitting the semiconductor wafer retention clip 1 to be rigidly mounted by appropriate screws or bolts about the circumference of a semiconductor wafer supporting pedestal, as taught in DiNapoli. The back or rear portion of the clip head 3 is provided with a depression tab 31 that is adapted for engagement with a tool for pushing the tab downward to overcome the spring bias provided by spring 13, causing the clip head to move in an arc-like manner away from contact with an associated semiconductor wafer on a pedestal, that is for either permitting installation of a semiconductor wafer on an associated pedestal or removal of a semiconductor wafer therefrom. The mounting column 19, as shown, includes two posts 33 and 35 separated by a recess 37 at the topmost portion of the mounting column 19.

With reference to FIG. 2, DiNapoli improved the semiconductor wafer retention clip 1 in providing the modified design 39 shown. The modified clip design 39 includes a clip head 41 that differs from the clip head 3 of FIG. 1, in having a notch like open area 43 for providing a pair of tines 43 and 45, each having a forwardly extending linear edge 47 and 49, respectively, that is narrower than the forwardly extending leading edge 7 of the clip 1 (more complete details of the modified clip 39 are given in DiNapoli).

Figure 3:
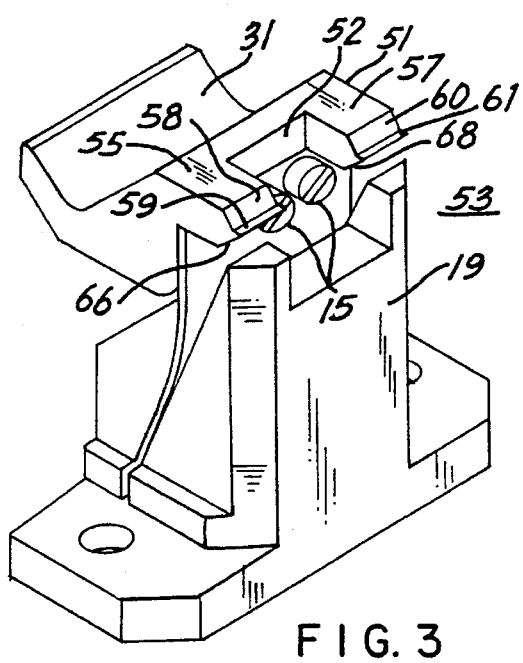
FIG. 3 is a prospective view of one embodiment of the invention for a clip for retaining semiconductor wafers on a pedestal.

The present inventors, in recognizing the persistent problem of high voltage arc over from the plasma to the metal portions of the clip head, particularly the mounting screws 15 for the metal spring 13, and the problem of plastic material or particulates from the clip head 41 falling onto the surface of the associated semiconductor wafer, in one embodiment designed a new clip head 51 for a semiconductor wafer retention clip 53 as shown in FIG. 3, to reduce these problems. In comparison to the prior clip head 41 of FIG. 2, in this embodiment of the invention, the new clip head 51 includes tines 55 and 57 that are configured differently than the tines 43 and 45, respectively, of clip head 41. As shown, tines 55 and 57 each include a forwardly projecting shelf or ledge 59, 61, respectively. The shelves 59 and 61 serve the purpose of catching or retaining debris resulting from decomposition of the material of clip head 51, thereby substantially reducing the amount of debris or particulate material that might otherwise fall onto the surface of the associated semiconductor wafer during processing thereof. This function of the shelves 59 and 61 is more apparent from FIG. 4, showing a clip head 51 with a frontwardly extending sloping lower face 66 spring biased against a top circumferential edge of a semiconductor wafer 65 positioned on a mounting head 67 on top of a pedestal 69. Note, as shown in FIG. 4, that the clip head 51, in being spring biased by spring 13 against the semiconductor wafer 63, is as a result slightly tilted relative to the horizontal plane of the semiconductor wafer 63, whereby the shelf 59 is at an angle tilting upward away from the surface of the semiconductor wafer 63. In this manner, the junction between the forwardly extending downwardly sloping front face 58 of tine 55 and ledge 59 serves as a trough 62 for trapping debris in a positive manner. Note that it is preferred that the front face 58 be sloped, but in some applications it may be at 90° with ledge 59, or even rearwardly sloped from the top to ledge 59. Other differences between the prior clip head 41 and the present clip head 51 of one embodiment of the invention are discussed in greater detail below.

Figure 7:
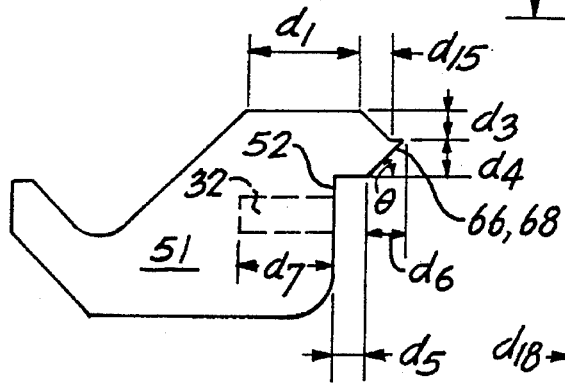
FIG. 7 is a side elevational view of the clip head of FIG. 3 of one embodiment of the invention.
Figure 8:
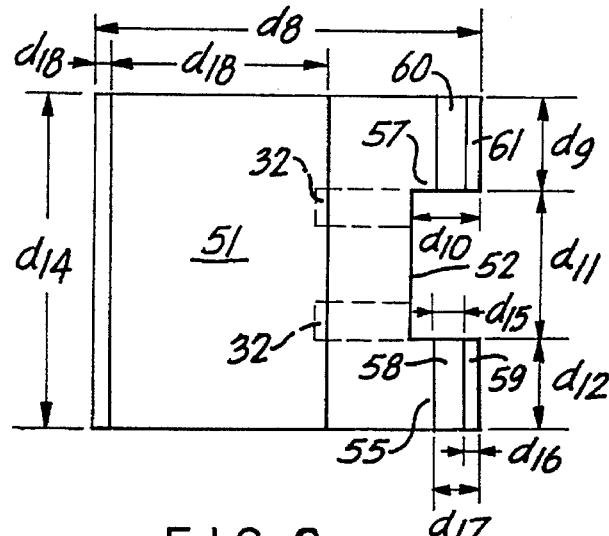
FIG. 8 is a top view of the clip head of FIG. 7.

FIG. 5 shows a side elevational view of the prior clip head 41 shown in perspective in FIG. 2. FIG. 6 is a top view of the prior art clip head 41. In comparison, FIG. 7 shows a side elevational view of one side of the present clip head 51, the other side being a mirror image thereof. FIG. 8 is a top view of the present clip head 51. Typical dimensions for the prior clip head 41, and present clip head 51, are shown in Table 1 below in fractions of an inch. These dimensions are shown as "$d_1$" through "$d_{19}$" A comparison of the dimensioning between corresponding surfaces between the clip heads 41 and 51 more specifically illustrates some of the design differences therebetween.

TABLE 1

| REFERENCE DIMENSION (INCH) | CLIP HEAD 41 | CLIP HEAD 51 |
| --- | --- | --- |
| d1 | .234 | .149 |
| d2 | .021 | — |

TABLE 1-continued

| REFERENCE DIMENSION (INCH) | CLIP HEAD 41 | CLIP HEAD 51 |
| --- | --- | --- |
| d3 | .021 | .041 |
| d4 | .07 | .050 |
| d5 | .07 | .045 |
| d6 | .07 | .050 |
| d7 | .125 | .125 |
| d8 | .570 | .525 |
| d9 | .125 | .127 |
| d10 | .140 | .095 |
| d11 | .250 | .200 |
| d12 | .125 | .127 |
| d13 | .021 | — |
| d14 | .454 | .454 |
| d15 | — | .041 |
| d16 | — | .020 |
| d17 | — | .061 |
| d18 | .295 | .295 |
| d19 | .020 | .020 |

From Table 1, it is clear that the present clip head 51 is shorter than the prior clip head 41. The depression tab 31 provided on the clip heads 41 and 51 are substantially identical, as illustrated by the dimensioning for $d_{18}$ and $d_{19}$. Also, the widths of the clip heads 41 and 51, as illustrated by $d_{14}$, are substantially identical. However, the frontmost portions of the clip heads 41 and 51 are substantially different both in design configuration, and dimensionally, as shown in the figures and Table 1.

Also, as taught in DiNapoli, the prior clip head 41 is configured with its tines "separated from one another by a space equal to at least twice the width of one of the tines" (column 3, lines 13–16, of DiNapoli 5,183,245). Contrary to this, for the present clip head 51, the tines are separated from one another by a space $d_{11}$ that is less than twice the width of each of the tines 55 and 57, in this example.

The lower frontwardly extending surfaces 63 and 64 of tines 43, 45, respectively, of the prior clip head 41, are at an angle of θ of about 45°. Similarly, the semiconductor wafer contacting surfaces 66 and 68 of tines 55, 57, respectively, of clip head 51, are also at an angle θ of about 45°, as shown in FIG. 7 for the present clip head 51. Otherwise, the dimensioning and design configuration of the front portions of the prior clip head 41 and present clip head 51 are substantially different. However, in this one embodiment of the invention, the other portions exclusive of the clip head 51 of the present semiconductor wafer retention clip 53 are substantially the same as those of the other features of the prior semiconductor wafer retention clip 39. Such other features include the mounting column 19, base 21, flanges 23 and 25, posts 33 and 35, metal leaf spring 13, mounting member 17, and screws 15. With regard to screws 15, note in FIGS. 5–8, the holes 32 for receiving the screws 15, in this example. The holes are formed in the front face 34 of prior clip head 41, and front face 52 of clip head 51, as shown in FIGS. 7 and 8, for example.

Figure 9:
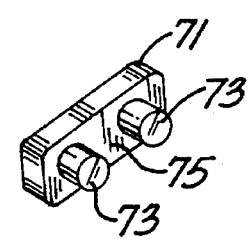
FIG. 9 is a perspective view of a spring retainer of another embodiment of the invention.
Figure 10:
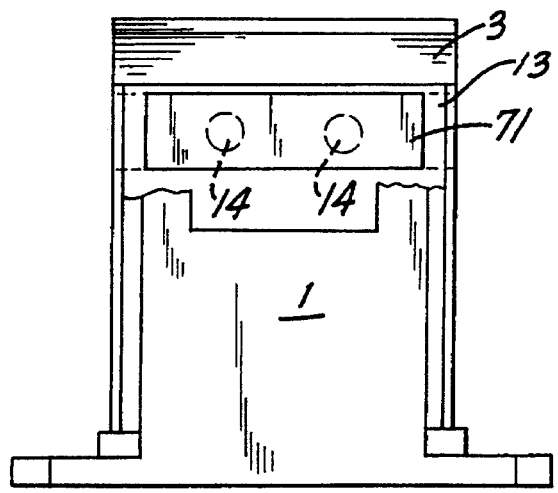
FIG. 10 is a partially cut away front elevational view of the clip of FIG. 1 incorporating the spring retainer of the present invention.
Figure 11:
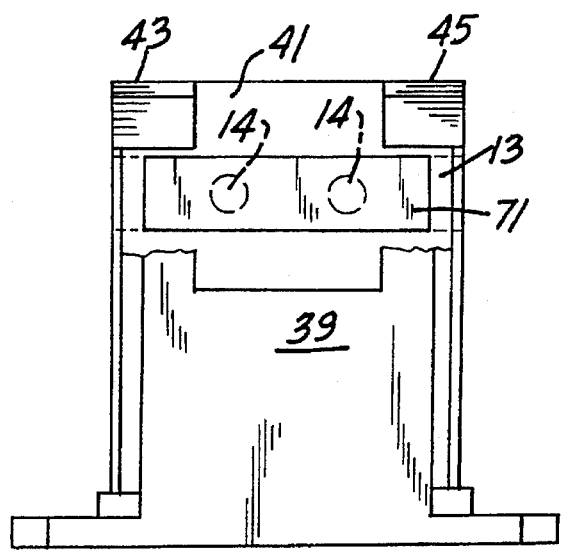
FIG. 11 is a partially cut away front elevational view of the clip of FIG. 2 incorporating the spring retainer of FIG. 9.
Figure 12:
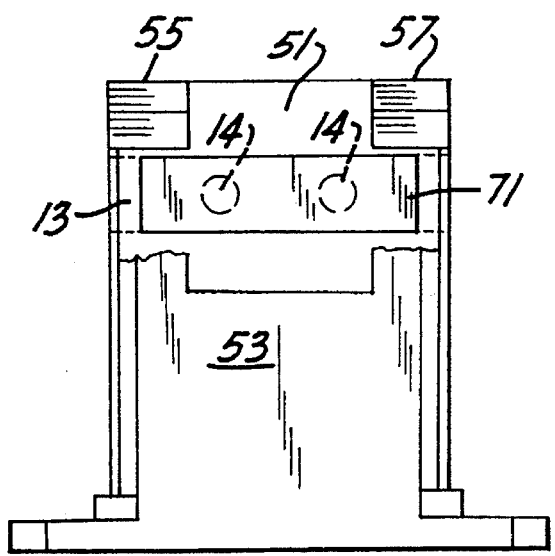
FIG. 12 is a partially cut away front elevational view of the semiconductor wafer retention clip of FIG. 3 incorporating the spring retainer embodiment of FIG. 9.

In another embodiment of the invention, the present inventors recognized that the metal screws 15 used in the prior clips 1 and 39 of FIGS. 1 and 2, respectively, and in one embodiment of the present clip 53 shown in FIG. 3, are one cause of the voltage arcing problem. This arcing problem is increased due to the increased exposure of the screws 15 caused by the open area 43 provided in the prior clip head 41, and the open area 52 provided in the clip head 51, relative to prior clip head 3 which does not have such open areas. To substantially reduce this voltage arcing problem, the present inventors conceived a spring retainer member 71, as shown in FIG. 9. The spring retainer 71 consists of a nonconductive material, such as a plastic material, and is shaped as a narrow rectangular strap-like piece with a pair of spaced apart studs 73 projecting from a bottom face thereof, as shown. The spring retainer 71 replaces the screws 15, and is applicable for substantially reducing the arcing problem when used with either of the prior clips 1 and 39 of FIGS. 1 and 2, respectively, or with the present clip 53 of FIG. 3, as illustrated in FIGS. 10–12, respectively. As shown, the spring retainer 71 is installed by pushing the posts 73 through the screw holes in the leaf spring 13, in place of screws 15, with the posts 73 then being pushed into holes 32 of the associated clip head 3, or 41, or 51, until the inside face 75 of spring retainer 71 is flush against the front face of the associated spring 13, whereafter the spring retainer 71 is ultrasonically welded to both the associated clip head 3, 41, and 51 and spring 13, for example. Other methods of affixation or rigid attachment such as epoxy adhesive can be used. Although in FIGS. 10–12, the length of the spring retainer member 71 is shown to be shorter than the width of the spring 13, the phantom lines or dash lines shown at the ends of the spring retainer 71 are meant to illustrate that the length of the spring retainer 71 can be adjusted, if the application requires, to be as long as the width of the associated spring 13. It is preferred that the length of the spring retainer 71 be no longer than the greater of the width of spring 13 or the width of the front faces of clip heads 1, 39, and/or 53, respectively. The holes 14 shown in phantom, illustrate the holes through spring 13 for receiving studs 73 of spring retainer 71. Note in FIG. 4, a spring retainer 71 is illustrated in use for retaining or rigidly attaching spring 13 to a clip head 51.

With further reference to FIG. 5, and to Table 1, and as taught in DiNapoli, for the prior clip head 41 the front-to-rear sloping surfaces 63, 64 of tines 43 and 45, respectively, have widths $d_6$ that are at least several times greater than the widths $d_2$ of the upper front-to-rear sloping surfaces 47, 49, respectively. Also, it is taught that the leading edge portions of the tines 43 and 45 are elevationally at least several times closer to the uppermost top side surfaces of the tines 43, 45 than to the lower most bottom side surfaces thereof.

The present clip head 51, with further reference to FIGS. 7 and 8, and Table 1, has a substantially different design, as previously mentioned. For example, the widths $d_6$ of the lower sloping surfaces 66, 68, of tines 55, 57, respectively, are almost equal to the widths $d_{15}$ of their associated upper front-to-rear sloping surfaces 58, 60, respectively. Also, in the prior clip head 41 of FIGS. 5 and 6, the leading edge of tines 43 and 45 is formed from the junction between the upper sloping surfaces 47, 49, respectively, with the lower sloping surfaces 63, 64, respectively. Contrary to this, in the present clip head 51 the leading edges of tines 55 and 57 are formed via the junction between the shelves or ledges 59, 61, respectively, with the lower sloping surfaces 66, 68, respectively. Also, the leading edges of the tines 55 and 57 are elevationally only slightly closer to the uppermost top surfaces of the tines 55, 57, respectively, than to the lower most bottom side surfaces thereof, respectively. Also, as previously mentioned, for prior clip head 41 the spacing d11 between tines 43 and 45 is at least twice the side-to-side widths $d_{12}$, $d_9$, respectively, of one of the tines, whereas in the present clip head 51 the comparable spacing between the tines 55 and 57 is less than the side-to-side width of either one of the tines 55 or 57. In the present clip head 51, relative to the prior clip head 41, the wider tines 55, 57 relative to the tines 43, 45 of the prior design, respectively, the shortened length of the present tines 55, 57 relative to the prior tines 43, 45, respectively, and the reduced spacing between the present tines 55 and 57, relative to the prior tines 43 and 45, respectively, helps to reduce the voltage arcing problem even if metal screws 15 are used to secure the spring 13 to the present clip head 51, as described above.

Although various embodiments of the invention have been shown and described herein, they are not meant to be limiting. Those of skill in the art may recognize certain modifications to these embodiments, which modifications are meant to be covered by the spirit and scope of the appended claims.

What is claimed is:

1. A retention clip apparatus for removably securing a semiconductor wafer on a pedestal, said clip apparatus comprising:

a clip head including:
      a rearmost depression tab;
      first and second spaced apart tines at a frontmost portion of said clip head, each of said first and second tines including a lower front face that is downwardly sloping from a front leading edge toward said depression tab, said lower front face providing a surface for contacting an associated semiconductor wafer, intermediate top surface means conjoined at an outer longitudinal edge with said lower front face for both forming said front leading edge and catching debris or particulate matter to substantially prevent its falling onto the surface of an associated said semiconductor wafer, an upper front face that is downwardly sloping toward said intermediate top surface and conjoined thereto along a common edge, an opposing edge of said upper front face to the latter common edge terminating at a top surface of the associated first or second tine;

a lower front face above which said first and second tines project away from and outward;

a base member;

spring bias means having one end secured to said lower front face of said clip head, and another end secured to said base member, for biasing said clip head toward said semiconductor wafer; and anti-arc spring retention bias means for securing said spring bias means to said clip head, and substantially reducing voltage arcing between said clip head and a surrounding plasma during processing of an associated semiconductor wafer.

2. The retention clip apparatus of claim 1, wherein for each of said first and second tines, said intermediate top surface means includes a rectangularly shaped surface.

3. The retainer slip apparatus of claim 2, wherein for each of said first and second tines, said rectangularly shaped surface is flat.

4. The retainer clip apparatus of claim 3, wherein for each of said first and second tines, said rectangularly shaped surface is parallel to horizontal planes of the top and bottom surfaces of said tines.

5. The retention clip apparatus of claim 1, wherein said anti-arc spring retention means includes:

a rectangular base member having a top and bottom surface;

at least one short stud projecting away from the bottom of said base member, for being pushed through a hole in said spring bias means;

said base member and said stud consisting of electrically nonconductive material, and being affixed to a front surface of said spring bias means and via said stud into a hole in the lower front face of said clip head.

6. The retention clip apparatus of claim 5, wherein said base member and at least one stud consist of a single piece of plastic material.

7. The retention clip apparatus of claim 1, wherein said anti-arc spring retention means includes:

a rectangular base member having top and bottom surfaces;

two spaced apart studs projecting away from the bottom of said base member, for being pushed through two holes through said spring bias means and into two holes in the lower front face of said clip head, whereby said base member is affixed to said spring bias means and said studs are affixed to said clip head; and said base member and studs consisting of electrically nonconductive material.

8. The retention clip apparatus of claim 7, wherein said base member and studs are formed from a single piece of plastic.

9. The retention clip apparatus of claim 5, wherein the length of said base member is no longer than the greater of the widths of said spring bias means or front face of said clip head.

10. The retention clip apparatus of claim 7, wherein the length of said base member is no longer than the greater of the widths of said spring bias means or front face of said clip head.

11. A clip head for use in retention clip apparatus for removably securing a semiconductor wafer on a pedestal, said clip head including a rearmost depression tab for receiving a tool, frontmost first and second tines spaced apart from one another and projecting away from a front face of said clip head, respectively, wherein the improvement comprises:

each one of said first and second tines including:
      an intermediate surface providing a ledge or shelf terminating at a leading forwardmost edge of the respective tine, for trapping debris or particulate matter that might otherwise fall onto the surface of an associated semiconductor wafer;
      an upper front face between a top surface thereof and an interior edge of said intermediate surface; and
      a lower front face sloping downwardly from the front-to-rear of said clip head between the leading edge of the associated tine and a bottom surface of the associated tine.

12. The clip head of claim 11, wherein said upper front face slopes downwardly from the rear-to-front of said clip.

13. The clip head of claim 11, wherein said intermediate surface is flat.

14. The clip head of claim 11, wherein said intermediate surface of each of said first and second tines is in a plane parallel to the horizontal planes of top and bottom surfaces of its associated tine.

15. The clip head of claim 11, wherein the space between said first and second tines is less than twice the side-to-side width of one of the tines.

16. The clip head of claim 11, wherein the leading edges of said first and second tines are slightly closer to the top than the bottoms of the associated tines.

17. The clip head of claim 11, wherein said first and second tines each have a rear-to-front width of the associated said upper front face slightly smaller than the front-to-rear width of the associated said lower front face.

18. The clip head of claim 11, wherein said first and second tines, and said depression tab are formed from a single piece of plastic material.

* * * * *

UNITED STATES PATENT AND TRADEMARK OFFICE
CERTIFICATE OF CORRECTION

PATENT NO. : 5,458,322
DATED : October 17, 1995
INVENTOR(S) : Richard Kulkaski, et. al.

It is certified that error appears in the above-indentified patent and that said Letters Patent is hereby corrected as shown below:

Title page, item [54] and col. 1, in the title, change title to read--

DEBRIS TRAPPING/ANTI-ARC CLIP FOR RETAINING --
A SEMICONDUCTOR WAFER ON A PEDESTAL--.

Signed and Sealed this

Thirtieth Day of January, 1996

Attest:

BRUCE LEHMAN

Attesting Officer            Commissioner of Patents and Trademarks